United States Patent
Lee et al.

(10) Patent No.: US 10,536,121 B2
(45) Date of Patent: Jan. 14, 2020

(54) AMPLIFIER ARCHITECTURES WITH BYPASS CIRCUITS AND RESONANT STRUCTURES

(71) Applicant: SKYWORKS SOLUTIONS, INC., Woburn, MA (US)

(72) Inventors: Junhyung Lee, Irvine, CA (US); Johannes Jacobus Emile Maria Hageraats, Kamuela, HI (US)

(73) Assignee: SKYWORKS SOLUTIONS, INC., Woburn, MA (US)

( * ) Notice: Subject to any disclaimer, the term of this patent is extended or adjusted under 35 U.S.C. 154(b) by 0 days.

(21) Appl. No.: 15/908,421

(22) Filed: Feb. 28, 2018

(65) Prior Publication Data

US 2018/0248526 A1     Aug. 30, 2018

Related U.S. Application Data

(60) Provisional application No. 62/465,025, filed on Feb. 28, 2018.

(51) Int. Cl.
| | |
|---|---|
| *H03F 3/72* | (2006.01) |
| *H03F 3/193* | (2006.01) |
| *H03F 3/21* | (2006.01) |
| *H03F 3/19* | (2006.01) |
| *H03F 3/24* | (2006.01) |
| *H03G 1/00* | (2006.01) |
| *H03G 5/28* | (2006.01) |
| *H03G 3/30* | (2006.01) |

(52) U.S. Cl.
CPC ............... *H03F 3/193* (2013.01); *H03F 3/19* (2013.01); *H03F 3/21* (2013.01); *H03F 3/245* (2013.01); *H03F 3/72* (2013.01); *H03G 1/0088* (2013.01); *H03G 5/28* (2013.01); *H03F 2200/111* (2013.01); *H03F 2200/387* (2013.01); *H03F 2200/451* (2013.01); *H03F 2203/7209* (2013.01); *H03F 2203/7233* (2013.01); *H03F 2203/7239* (2013.01); *H03G 3/3036* (2013.01)

(58) Field of Classification Search
CPC ..................................... H03F 1/56; H03F 3/72
USPC .................................................. 330/51, 305
See application file for complete search history.

(56) References Cited

U.S. PATENT DOCUMENTS

| | | | | |
|---|---|---|---|---|
| 7,479,827 B2* | 1/2009 | Hau | ...................... | H03F 1/0261 330/151 |
| 2016/0276983 A1* | 9/2016 | Vaillancourt | ........... | H03F 3/195 |

\* cited by examiner

*Primary Examiner* — Steven J Mottola
(74) *Attorney, Agent, or Firm* — Chang & Hale LLP

(57) ABSTRACT

The disclosed technology is related to a radio-frequency (RF) amplifier having a bypass circuit and a resonant structure to improve performance in a bypass mode (e.g., a low gain mode). The disclosed amplifiers have a resonant structure that effectively isolates an amplifier core from a bypass circuit. For example, in a bypass mode, the resonant structure is configured to create an open impedance looking into the amplifier core input. This effectively removes any loading from the amplifier core to the bypass circuit. The disclosed amplifiers with resonant structures improve linearity performance in bypass modes due at least in part to the open impedance to the amplifier core provided by the resonant structure.

17 Claims, 8 Drawing Sheets

AMPLIFIER ARCHITECTURES WITH BYPASS CIRCUITS AND RESONANT STRUCTURES

CROSS-REFERENCE TO RELATED APPLICATIONS

This application claims priority to U.S. Provisional Application No. 62/465,025 filed Feb. 28, 2018 and entitled "AMPLIFIER ARCHITECTURES WITH BYPASS CIRCUITS AND RESONANT STRUCTURES," which is expressly incorporated by reference herein in its entirety for all purposes.

BACKGROUND

Field

The present disclosure generally relates to amplifiers for wireless communication applications.

Description of Related Art

Wireless communication devices typically include components in a front-end module that are configured to amplify received radio-frequency (RF) signals. The front-end module can be configured to provide a plurality of gain modes to provide different levels of amplification.

SUMMARY

According to a number of implementations, the present disclosure relates to a variable-gain signal amplifier configured to operate in one or more gain modes and in a bypass mode. The amplifier includes an input node configured to receive an input signal. The amplifier also includes an output node configured to provide an output signal. The amplifier also includes an amplifier core configured to amplify the input signal and to provide the amplified output signal to the output node in the one or more gain modes. The amplifier also includes a resonant structure configured to provide a substantially open impedance in the bypass mode. The amplifier also includes a bypass circuit coupled to the input node, the resonant structure, and the output node, the bypass circuit including a bypass switch configured to provide a bypass path from the input node to the output node that bypasses the amplifier core in the bypass mode.

In some embodiments, the resonant structure includes a resonant structure switch, a capacitor, and an inductor in parallel with the capacitor. In further embodiments, the capacitor of the resonant structure is a variable capacitor. In further embodiments, the resonant structure switch is coupled in series with the capacitor. In yet further embodiments, the resonant structure switch and the capacitor are coupled in parallel with the inductor. In further embodiments, the resonant structure switch is open in the one or more gain modes and the resonant structure switch is closed in the bypass mode. In further embodiments, the inductor is configured to provide input impedance matching for the amplifier.

In some embodiments, the amplifier further includes an amplifier core output switch configured to selectively couple the output node to an output of the amplifier core. In further embodiments, the amplifier core switch is open in the bypass mode.

In some embodiments, the variable-gain signal amplifier comprises a low-noise amplifier. In some embodiments, the bypass circuit does not include an LC matching circuit in parallel with the amplifier core. In some embodiments, the bypass circuit provides a bypass path for signals from the input node to the output node, the bypass path not including the resonant structure or the amplifier core. In some embodiments, the bypass circuit provides a bypass path for signals from the input node to the output node, the bypass path configured to bypass the inductor coupled to the input node. In some embodiments, the amplifier further includes a control circuit configured to generate an amplification control signal to switch between the one or more gain modes and the bypass mode.

According to a number of implementations, the present disclosure relates to a radio-frequency module that includes a packaging substrate configured to receive a plurality of components. The module also includes an amplifier implemented on the packaging substrate, the amplifier configured to provide one or more gain modes and a bypass mode, the amplifier including an input node and an output node, the amplifier further including an amplifier core configured to amplify an input signal and to provide an amplified output signal to the output node, the amplifier further including a resonant structure including a resonant structure switch, a capacitor, and an inductor in parallel with the capacitor, and the amplifier further including a bypass circuit coupled to the input node, the resonant structure, and the output node, the bypass circuit having a bypass switch configured to provide a bypass path from the input node to the output node that bypasses the amplifier core in the bypass mode.

In some embodiments, the amplifier is implemented on a semiconductor die that is mounted on the packaging substrate. In some embodiments, the resonant structure is implemented on a single semiconductor die with the amplifier core and the bypass circuit, the semiconductor die being mounted on the packaging substrate. In some embodiments, the amplifier core and the bypass circuit are implemented on a semiconductor die that does not include the resonant structure.

According to a number of implementations, the present disclosure relates to a wireless device that includes an antenna configured to at least receive a radio-frequency signal. The wireless device also includes a variable gain signal amplifier in communication with the antenna and configured to provide one or more gain modes and a bypass mode, the amplifier including an input node and an output node, the amplifier also including an amplifier core configured to amplify an input signal to provide an output signal to the output node, the amplifier also including a resonant structure including a resonant structure switch, a capacitor, and an inductor in parallel with the capacitor, and the amplifier also including a bypass circuit coupled to the input node, the resonant structure, and the output node, the bypass circuit having a bypass switch configured to provide a bypass path from the input node to the output node that bypasses the amplifier core in the bypass mode to provide the output signal at the output node. The wireless device also includes a controller implemented to control the variable gain signal amplifier to switch between the one or more gain modes and the bypass mode.

In some embodiments, the wireless device further includes a transceiver configured to process the output signal provided by the amplifier.

For purposes of summarizing the disclosure, certain aspects, advantages and novel features have been described herein. It is to be understood that not necessarily all such advantages may be achieved in accordance with any particular embodiment. Thus, the disclosed embodiments may

DETAILED DESCRIPTION OF SOME EMBODIMENTS

Figure 1:
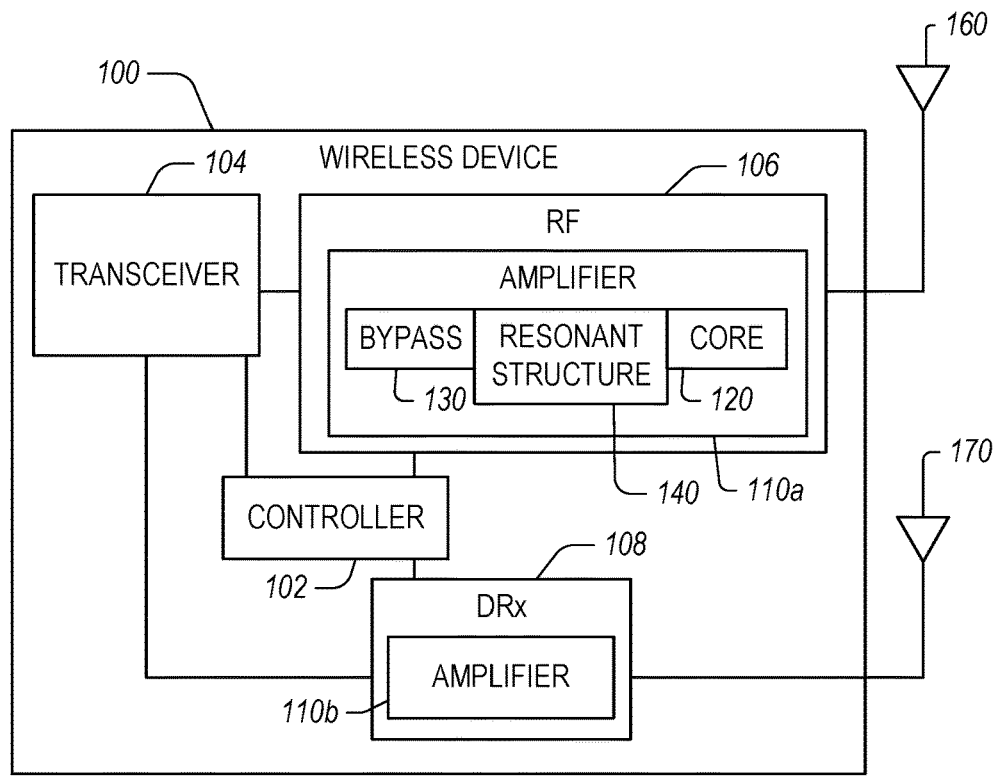
FIG. 1 illustrates a wireless device having a primary antenna and a diversity antenna and also having the disclosed amplifier architectures.

The headings provided herein, if any, are for convenience only and do not necessarily affect the scope or meaning of the claimed invention.

Overview

In many wireless applications, receivers typically require large dynamic range, and such a requirement can be achieved through multiple gain states with varying levels of gain, noise figure, and linearity. For example, a signal with relatively little power may require a gain state with a higher gain, a lower noise figure, and a reasonable but not extremely high linearity performance. A signal with relatively high power may require a lower gain, a relaxed noise figure, and a high linearity to amplify the signal with targeted fidelity. For some signals with relatively high power, it may be advantageous to bypass amplification to preserve the characteristics of the received signal.

In amplifiers with bypass circuits, there may be relatively high loss through the bypass circuit due at least in part to loading of the amplifier core being bypassed, limitations on the size of bypass switches, and/or limitations on the quality factors (Q) of passive components in the bypass circuit. Moreover, performance in the bypass path is coupled and/or depends on performance of the other gain modes. For example, optimizing performance through the bypass circuit may undesirably affect performance through the amplifier core in one or more gain modes. Similarly, optimizing performance in one or more gain modes (e.g., a high gain mode) may negatively affect performance through the bypass path. In particular, there may be tradeoffs in performance for high gain modes and bypass modes. This may occur due at least in part to limitations in switch sizes in the bypass circuit. Furthermore, this may occur due at least in part to sizes for the amplifier core. For example, larger switch sizes for the bypass circuit can reduce losses in that circuit but can negatively affect high gain mode performance due to added loading from the switch. In addition, linearity (e.g., IIP3) in the bypass circuit may suffer due at least in part to active core loading of the amplifier core.

Accordingly, described herein are architectures, circuits, devices, and methods related to, among others, a radio-frequency (RF) amplifier having a bypass circuit and a resonant structure to improve performance in a bypass mode (e.g., a low gain mode). The disclosed amplifiers have a resonant structure that effectively isolates an amplifier core from a bypass circuit. For example, in a bypass mode, the resonant structure is configured to create an open impedance looking into the amplifier core input. This effectively removes any loading from the amplifier core to the bypass circuit. Advantageously, the disclosed amplifier architectures allow for the amplifier core and the bypass circuit to be independently designed to improve and/or optimize performance through the bypass path and for one or more gain modes through the amplifier core. For example, the disclosed circuits enable independence between the size of the amplifier core and the loss through the bypass circuit, allowing the amplifier core to be optimized or tailored to achieve targeted performance characteristics in one or more gain modes. The resonant structure can be configured to cover a relatively large frequency range. In some embodiments, the resonant structure includes a variable capacitor that can be tuned to cover different frequency ranges. The resonant structure enables removal of an inductor-capacitor (LC) matching stage from the bypass path. The LC matching stage can be removed from the bypass path due at least in part to the resonant structure substantially eliminating amplifier core input loading, allowing a direct input to the low-loss bypass path. Additionally, the disclosed amplifiers with resonant structures as described herein improve linearity performance in bypass modes due at least in part to the open impedance to the amplifier core provided by the resonant structure.

FIG. 1 illustrates a wireless device 100 having a primary antenna 160 and a diversity antenna 170. The wireless device 100 includes an RF module 106 and a transceiver 104 that may be controlled by a controller 102. The transceiver 104 is configured to convert between analog signals (e.g., radio-frequency (RF) signals) and digital data signals. To that end, the transceiver 104 may include a digital-to-analog converter, an analog-to-digital converter, a local oscillator for modulating or demodulating a baseband analog signal to or from a carrier frequency, a baseband processor that converts between digital samples and data bits (e.g., voice or other types of data), or other components.

The RF module 106 is coupled between the primary antenna 160 and the transceiver 104. Because the RF module 106 may be physically close to the primary antenna 160 to reduce attenuation due to cable loss, the RF module 106 may be referred to as front-end module (FEM). The RF module 106 may perform processing on an analog signal received from the primary antenna 160 for the transceiver 104 or received from the transceiver 104 for transmission via the primary antenna 160. To that end, the RF module 106 may include filters, power amplifiers, low noise amplifiers, band select switches, attenuators, matching circuits, and other components.

When a signal is transmitted to the wireless device 100, the signal may be received at both the primary antenna 160 and the diversity antenna 170. The primary antenna 160 and diversity antenna 170 may be physically spaced apart such that the signal at the primary antenna 160 and diversity antenna 170 is received with different characteristics. For example, the primary antenna 160 and the diversity antenna 170 may receive the signal with different attenuation, noise, frequency response, and/or phase shift. The transceiver 104 may use both of the signals with different characteristics to determine data bits corresponding to the signal. In some implementations, the transceiver 104 selects from between the primary antenna 160 and the diversity antenna 170 based on the characteristics, such as selecting the antenna with the highest signal-to-noise ratio. In some implementations, the transceiver 104 combines the signals from the primary antenna 160 and the diversity antenna 170 to increase the signal-to-noise ratio of the combined signal. In some implementations, the transceiver 104 processes the signals to perform multiple-input/multiple-output (MiMo) communication.

In some embodiments, the diversity antenna 170 is configured to receive signals within multiple cellular frequency bands and/or wireless local area network (WLAN) frequency bands. In such embodiments, the wireless device 100 can include a multiplexer, switching network, and/or filter assembly coupled to the diversity antenna 170 that is configured to separate the diversity signal into different frequency ranges. For example, the multiplexer can be configured to include a low-pass filter that passes a frequency range that includes low band cellular frequencies, a band-pass filter that passes a frequency range that includes low band WLAN signals and mid-band and high-band cellular signals, and a high pass filter that passes a frequency range that includes high-band WLAN signals. This example is merely for illustrative purpose. As another example, the multiplexer can have a variety of different configurations such as a diplexer that provides the functionality of a high-pass filter and a low-pass filter.

Because the diversity antenna 170 is physically spaced apart from the primary antenna 160, the diversity antenna 170 can be coupled to the transceiver 104 by a transmission line, such as a cable or a printed circuit board (PCB) trace. In some implementations, the transmission line is lossy and attenuates the signal received at the diversity antenna 170 before it reaches the transceiver 104. Thus, in some implementations, gain is applied to the signal received at the diversity antenna 170. The gain (and other analog processing, such as filtering) may be applied by the diversity receiver module 108. Because such a diversity receiver module 108 may be located physically close to the diversity antenna 170, it may be referred to as a diversity receiver front-end module (DRx), examples of which are described in greater detail herein.

The RF module 106 and the diversity receiver module 108 include variable gain amplifiers 110*a*, 110*b* configured to provide a plurality of gain modes to amplify signals from the primary antenna 160 and the diversity antenna 170, respectively. The variable gain amplifiers 110*a*, 110*b* are also configured to provide a bypass mode that bypasses amplification. Each variable gain amplifier 110*a*, 110*b* can include an amplifier core 120, a bypass circuit 130, and a resonant structure 140 that provides a relatively large impedance around an operating frequency to effectively decouple the amplifier core 120 and the bypass circuit 130 in the bypass mode. Signals received at the variable gain amplifiers 110*a*, 110*b* can be amplified using the amplifier core 120 or the signals can be allowed to bypass the amplifier core 120 through the bypass circuit 130, as described in greater detail herein. The operating mode (e.g., gain mode, bypass mode, etc.) of the variable gain amplifiers 110*a*, 110*b* can be controlled by the controller 102. The bypass circuit 130 and/or resonant structure 140 can be selectively activated through the operation of switches in the respective circuits. Performance through the bypass path can be enhanced by decreasing loading of the amplifier core input, for example, which can be achieved by providing a relatively large impedance, similar to an open circuit, at the input of the amplifier core using the resonant structure 140. In some embodiments, the variable gain amplifier 110*a*, 110*b* can receive multiple input signals and output a single signal or a plurality of output signals. In certain implementations, individual inputs can have corresponding individual amplifier cores, resonant structures, and/or bypass paths.

Figure 5A:
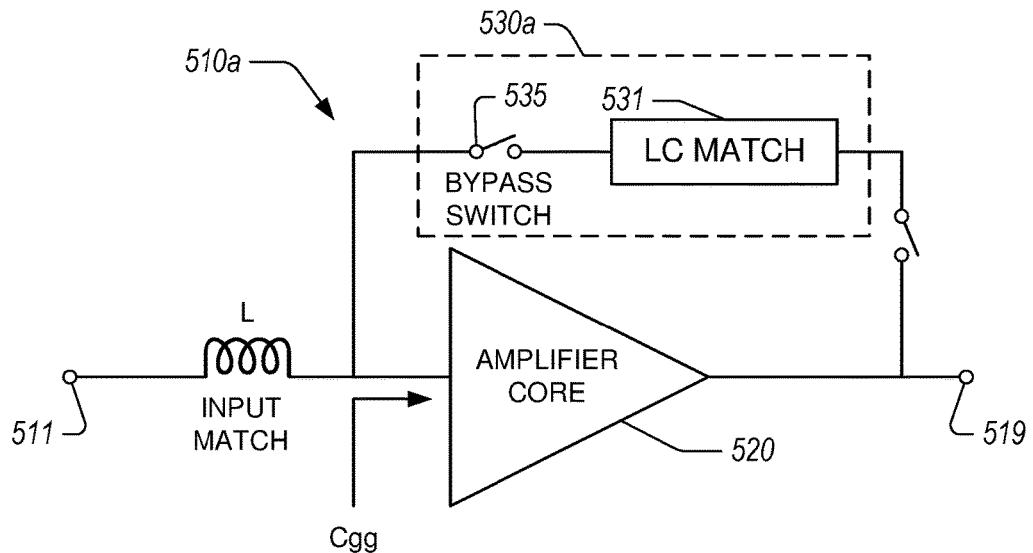
FIG. 5A illustrates an example amplifier architecture that includes an amplifier core and a bypass circuit that includes an LC matching module.

Advantageously, the architecture of the variable gain amplifier 110*a*, 110*b* can effectively or substantially isolate the amplifier core 120 and the bypass circuit 140 from one another by way of the resonant structure 140. The resonant structure 140 creates an open impedance (e.g., an impedance approaching infinity at a resonant frequency) looking into the input of the amplifier core 120, thereby substantially removing loading from the amplifier core 120 to the bypass circuit 130. In some embodiments, this can result in about 2 dB to several dB improvement in loss (depending at least in part on the Q factor of the input match) compared to a similar bypass circuit and amplifier core configuration without the resonant structure 140 (an example of which is described herein with reference to FIG. 5A). With the bypass circuit 130 and the amplifier core 120 isolated from one another, each can be independently tailored or optimized to improve performance in their respective operating modes (e.g., gain mode and bypass mode). In some embodiments, the resonant structure 140 includes a variable capacitor so that the resonant frequency can be varied to cover different frequency ranges. Notably, the bypass circuit 130 does not include an LC matching stage (e.g., components configured to provide impedance matching) due at least in part to the amplifier core 120 being isolated from the bypass circuit in the bypass mode, thereby providing a direct, low-loss path from the input to the output of the amplifiers 110*a*, 110*b*. This isolation removes loading on the bypass circuit 130 from the input of the amplifier core 120 including input match. Furthermore, in some embodiments, with the open impedance looking into the amplifier core 120, linearity of the bypass circuit 130 is improved (e.g., IIP3 improvement in the bypass mode).

The controller 102 can be configured to generate and/or send control signals to other components of the wireless device 100. In some embodiments, the controller 102 provides signals based at least in part on specifications provided by the mobile industry processor interface alliance (MIPI®) Alliance). The controller 102 can be configured to receive signals from other components of the wireless device 100 to process to determine control signals to send to other components. In some embodiments, the controller 102 can be configured to analyze signals or data to determine control signals to send to other components of the wireless device 100. The controller 102 can be configured to generate control signals based on gain modes provided by the wireless device 100. For example, the controller 102 can send control signals to the variable gain amplifiers 110a, 110b to control the gain mode. Similarly, the controller 102 can be configured to generate control signals to control the variable gain amplifier 110a, 110b to provide a bypass path through the bypass circuit 130.

In some implementations, the controller 102 generates amplifier control signal(s) based on a quality of service metric of an input signal received at the input. In some implementations, the controller 102 generates the amplifier control signal(s) based on a signal received from a communications controller, which may, in turn, be based on a quality of service (QoS) metric of the received signal. The QoS metric of the received signal may be based, at least in part, on the diversity signal received on the diversity antenna 170 (e.g., an input signal received at the input). The QoS metric of the received signal may be further based on a signal received on a primary antenna 160. In some implementations, the controller 102 generates the amplifier control signal(s) based on a QoS metric of the diversity signal without receiving a signal from the communications controller. In some implementations, the QoS metric includes a signal strength. As another example, the QoS metric may include a bit error rate, a data throughput, a transmission delay, or any other QoS metric. In some implementations, the controller 102 controls the gain (and/or current) of the amplifiers in the variable gain amplifiers 110a, 110b. In some implementations, the controller 102 controls the gain of other components of the wireless device based on an amplifier control signal.

In some implementations, the variable gain amplifiers 110a, 110b may include a step-variable gain amplifier configured to amplify received signals with a gain of one of a plurality of configured amounts indicated by an amplifier control signal. In some implementations, the variable gain amplifiers 110a, 110b may include a continuously-variable gain amplifier configured to amplify received signals with a gain proportional to or dictated by the amplifier control signal. In some implementations, the variable gain amplifiers 110a, 110b may include a step-variable current amplifier configured to amplify received signals by drawing a current of one of plurality of configured amounts indicated by the amplifier control signal. In some implementations, the variable gain amplifiers 110a, 110b may include a continuously-variable current amplifier configured to amplify received signals by drawing a current proportional to the amplifier control signal.

Figure 2:
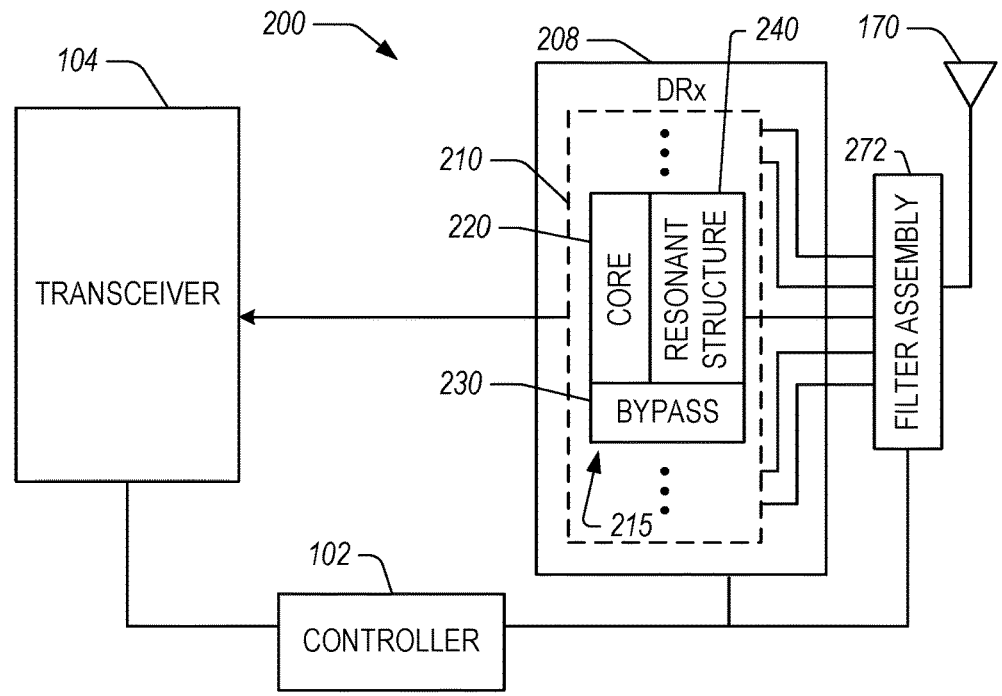
FIG. 2 illustrates a diversity receiver (DRx) configuration including a DRx front-end module (FEM) and also having a plurality of amplifier modules with the disclosed amplifier architectures.

FIG. 2 illustrates a diversity receiver (DRx) configuration 200 including a DRx front-end module (FEM) 208. The DRx configuration 200 includes a diversity antenna 170 that is configured to receive a diversity signal and to provide the diversity signal to the DRx FEM 208 through a filter assembly 272. The filter assembly 272 can include a multiplexer, for example, that is configured to selectively direct signals within targeted frequency ranges along respective paths to a multi-input amplifier 210 that includes one or more amplification modules 215 for the respective inputs. Each amplification module 215 can include an amplifier core 220, a bypass circuit 230, and a resonant structure 240. The signals can be radio frequency (RF) signals that include, for example and without limitation, cellular signals (e.g., low-, mid-, high- and/or ultra-high-band cellular frequencies), WLAN signals, BLUETOOTH® signals, GPS signals, and the like.

The DRx FEM 208 is configured to perform processing on the diversity signals received from the filter assembly 272. For example, the DRx FEM 208 may be configured to filter the diversity signals to one or more active frequency bands that can include cellular and/or WLAN frequency bands. The controller 102 can be configured to control the DRx FEM 208 to selectively direct signals to targeted filters to accomplish the filtering. As another example, the DRx FEM 208 may be configured to amplify one or more of the filtered signals using the amplifier 210. To that end, the DRx FEM 208 may include filters, low-noise amplifiers, band select switches, matching circuits, and other components. The controller 102 can be configured to interact with components in the DRx FEM 208 to intelligently select paths for the diversity signals through the DRx FEM 208.

The DRx FEM 208 transmits at least a portion of the processed diversity signals to the transceiver 104. The transceiver 104 may be controlled by the controller 102. In some implementations, the controller 102 may be implemented within the transceiver 104.

The DRx FEM 208 can be configured to provide one or more gain modes and a bypass mode. In the bypass mode, the resonant structure 240 can provide a large impedance, and for some frequencies, an impedance that effectively acts as an open circuit, to substantially isolate the amplifier core 220 from the bypass circuit 230. Thus, in the bypass mode, signals can pass through the amplification module 215 with little insertion loss and may be relatively unaffected by any loading at the input of the amplifier core 220. The resonant structure 240 can be tuned for frequencies that are to be amplified by the corresponding amplification module 215.

In some embodiments, the amplifier 210 can have an amplification module 215 for each output of the filter assembly 272. In certain embodiments, the amplifier 210 can have a plurality of amplification modules 215, each amplification module 215 configured to receive signals from one or more frequency bands. In various implementations, the respective resonant structures 240 of the amplification modules 215 are configured to resonate at a frequency within the one or more frequency bands received by the amplification module 215. In certain embodiments, at least one resonant frequency of a resonant structure 240 differs from the resonant frequency of another resonant structure 240. As described herein, the resonant frequency of the resonant structure 240 may be tuned. Accordingly, in some embodiments, the resonant frequencies of the resonant structures 240 may be individually tuned to achieve desired performance characteristics.

In some embodiments, the DRx configuration 200 is configured to bypass amplification when operating in a low gain mode (e.g., a bypass mode) and to amplify signals with the amplifier 220 when operating in other gain modes. The resonant structure 240 can be configured to allow the DRx configuration 200 to tailor properties of the amplifier cores 220 and the bypass circuits 230 to achieve targeted performance characteristics across different gain modes. In particular, performance may be tuned in the bypass mode without substantially affecting performance in one or more high gain modes due at least in part to the resonant structure 240.

In some embodiments, the amplifier 210 is configured to receive a plurality of input signals and to provide a single output signal. In certain embodiments, the amplifier 210 can be configured to receive a plurality of input signals and provide a corresponding plurality of output signals. The filter assembly 272 can be configured to direct signals corresponding to particular frequency bands along designated paths to the amplifier 210. In certain implementations, the amplifier 210 can provide different gain modes for the received signals. In certain implementations, the amplifier 210 can operate in a bypass configuration such that the signal passes through the bypass circuit 230 and in an amplification configuration such that the signal passes through the amplifier core 220. The resonant structure 240 advantageously allows the DRx FEM 208 to provide variable gain and/or a plurality of gain modes while reducing negative impacts on performance in the bypass configuration relative to amplifiers without the resonant structure 240.

The amplifier 210 can include any suitable amplifier circuit configured to provide a desired or targeted amplification. In some embodiments, the amplifier 210 includes a low-noise amplifier (LNA) circuit configured to amplify signals from a plurality of frequency bands (e.g., cellular frequency bands and/or WLAN frequency bands) received at a plurality of inputs, or a multi-input LNA. However, it is to be understood that the embodiments described herein are not to be limited to implementations that utilize low-noise amplifiers but include implementations that use any of a variety of amplifiers.

The amplifier 210 can be configured to amplify signals based at least in part on a plurality of gain modes. For example, the amplifier 210 can be configured to provide a first amplification or gain for a first gain mode, a second amplification or gain for a second gain mode, and so on. The amplifier 210 can be controlled by the controller 102 to control the gain provided at the amplifier 210. For example, the controller 102 can provide a signal indicative of a desired or targeted gain to the amplifier 210 and the amplifier 210 can provide the targeted gain. The controller 102 may receive an indication of the targeted gain from another component in a wireless device, for example, and control the amplifier 210 based at least in part on that indication. Similarly, the resonant structure 240 and the bypass circuit can be controlled by the controller 102.

Example Amplifiers with Resonant Structures and Bypass Circuits

Front end modules generally include amplifiers such as low-noise amplifiers (LNAs) to amplify received signals. In wireless devices that provide a variety of gain modes, it may be advantageous to provide a bypass path for relatively large signals. Accordingly, for at least one gain mode (e.g., a low gain mode or a bypass mode), it may be advantageous to bypass the amplifier core to improve performance (e.g., linearity).

Accordingly, provided herein are signal amplifiers that provide improved performance in low gain modes where an amplifier core is bypassed (e.g., in a bypass mode). The signal amplifiers include LC tank circuits at an input of the amplifier core to provide a relatively large impedance at a targeted frequency so that, in the low gain mode, signals bypass the amplifier core with little or no negative effects caused by loading at the input of the amplifier core or caused by input matching components in the bypass path. This advantageously reduces or eliminates performance penalties the low gain mode.

Figure 3:
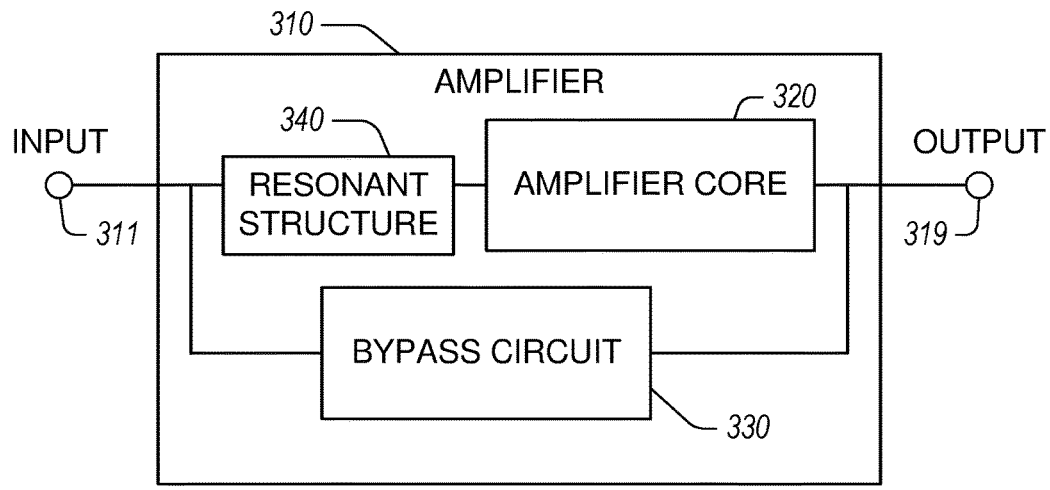
FIG. 3 illustrates an example variable-gain signal amplifier with a resonant structure and configured to operate in one or more gain modes and in a bypass mode.

FIG. 3 illustrates an example variable-gain signal amplifier 310 configured to operate in one or more gain modes and in a bypass mode. The amplifier 310 includes an input node 311 configured to receive an input signal. The amplifier 310 includes an output node 319 configured to provide an output signal. The amplifier 310 includes an amplifier core 320 configured to amplify the input signal and to provide the amplified output signal to the output node 319 in the one or more gain modes. The amplifier 310 includes a resonant structure 340 coupled to the input node 311, the resonant structure 340 configured to provide a substantially open impedance in the bypass mode. The amplifier 310 includes a bypass circuit 330 coupled to the input node 311, the resonant structure 340, and the output node 319. The bypass circuit 330 is configured to provide a bypass path from the input node 311 to the output node 319 that bypasses the amplifier core 320.

In various embodiments, the resonant structure 340 includes components, such as an inductor and a capacitor in parallel, to create a tank circuit that has a large impedance (e.g., approaching infinite impedance or an open circuit equivalent) at a resonant frequency determined by the values of the inductor and capacitor. When the resonant structure 340 is activated (e.g., by way of a switch) in a bypass mode, signals at the input node 311 travel through the bypass circuit 330 due at least in part to the resonant structure 340 providing a large impedance to the input signals.

Figure 4:
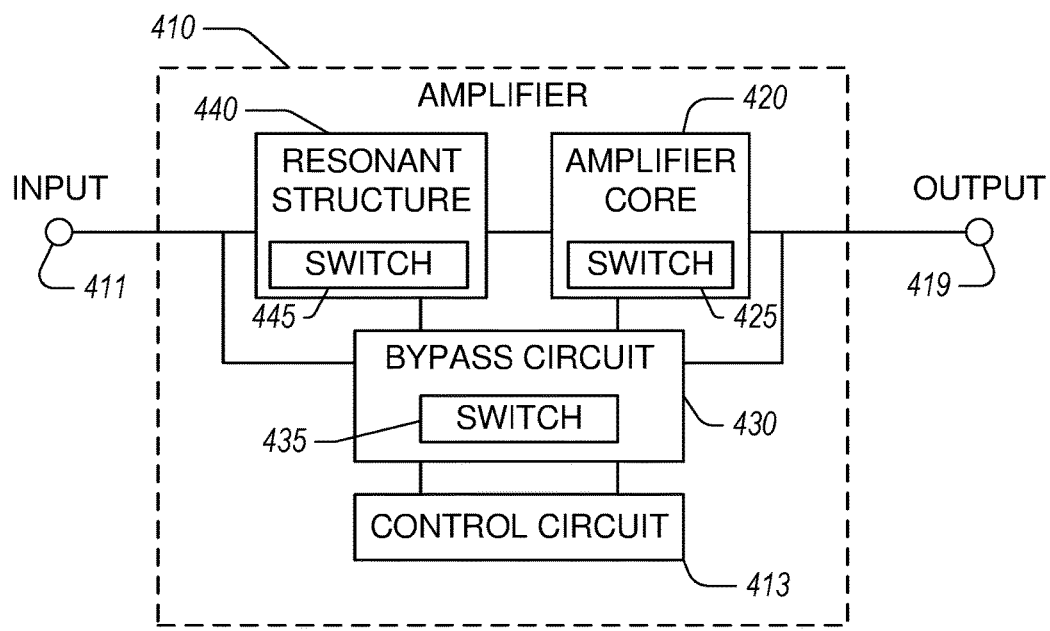
FIG. 4 illustrates an example amplifier architecture that includes an amplifier core, a bypass circuit, and a resonant structure, similar to the amplifier of FIG. 3.

FIG. 4 illustrates an example amplifier architecture 410 that includes an amplifier core 420, a bypass circuit 430, and a resonant structure 440, similar to the amplifier 310 described herein with reference to FIG. 3. Each of the amplifier core 420, the bypass circuit 430, and the resonant structure 440 include switches, respectively amplifier core switch 425, bypass switch 435, and resonant structure switch 445. Furthermore, the amplifier architecture 410 includes control circuit 413 configured to provide control signals to the amplifier core 420, the bypass circuit 430, and the resonant structure 440.

The resonant structure switch 445 can be selectively opened and closed to provide a relatively large impedance for input signals at the input node 411. The resonant structure switch 445 can be open in one or more gain modes and closed in a bypass mode. In some embodiments, with the resonant structure switch 445 open the resonant structure 440 provides input matching for the amplifier core 420, and with the resonant structure switch 445 closed the resonant structure 440 provides a large impedance (e.g., an open circuit) for input signals that effectively isolates the amplifier core 420 from the bypass circuit 430. The bypass switch 435 can be opened and closed to selectively provide a bypass path for input signals at the input node 411, thereby providing an output signal at the output node 419. The amplifier core switch 425 can be opened and closed to selectively provide an amplification pass through the amplifier core 420 for input signals at the input node 411. The amplifier core switch 425 can be configured to selectively couple the output node 419 to an output of the amplifier core 420 to provide an amplified output signal at the output node 419 in one or more gain modes. The amplifier core switch 425 can be open in the bypass mode. In some embodiments, the control circuit 413 can be configured to selectively open and close the switches 425, 435, 445.

Figure 5B:
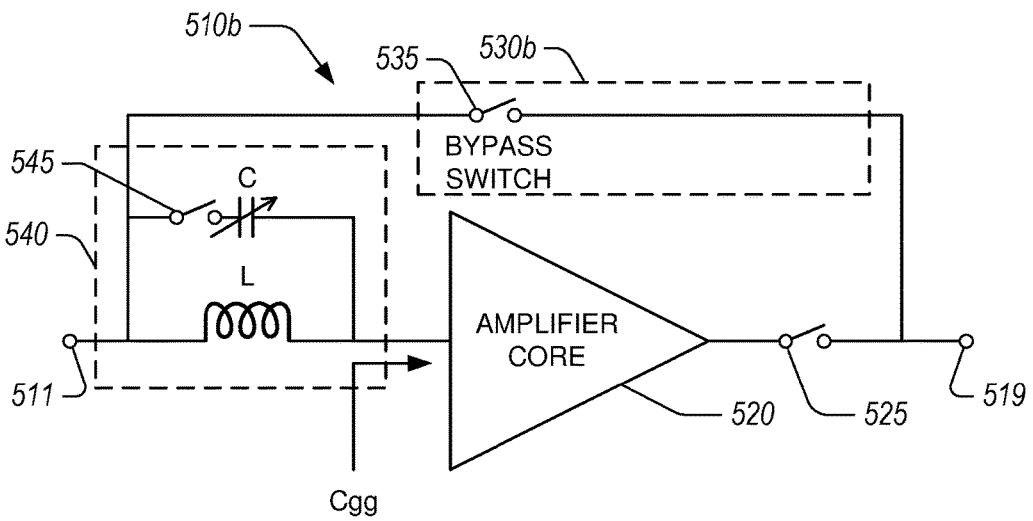
FIGS. 5B, 5C, and 5D illustrate example amplifier architectures that include a resonant structure that includes a matching inductor, a variable capacitor, and a resonant structure switch.
Figure 5C:
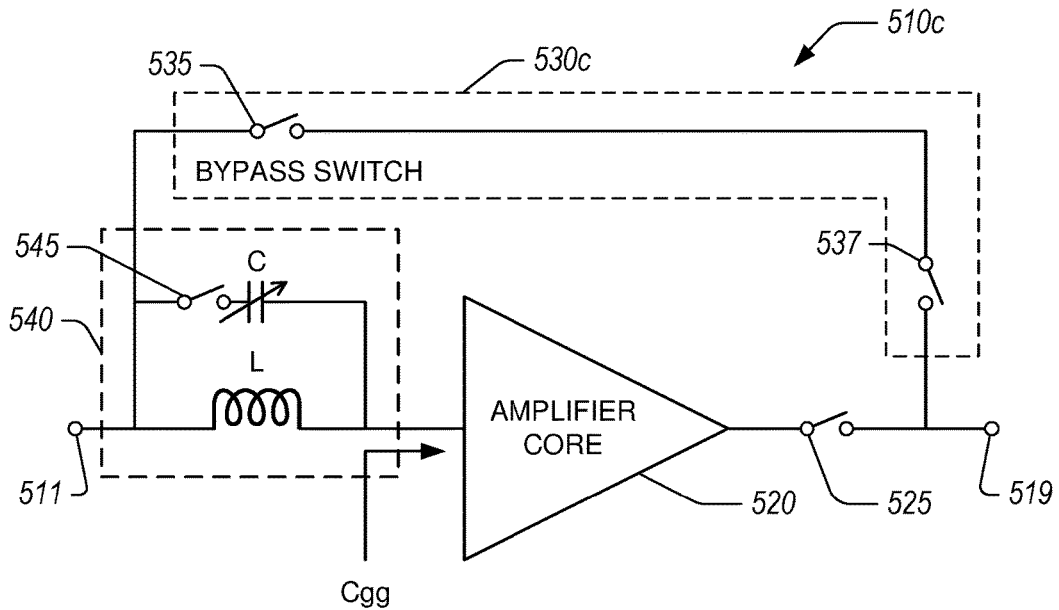
Figure 5D:
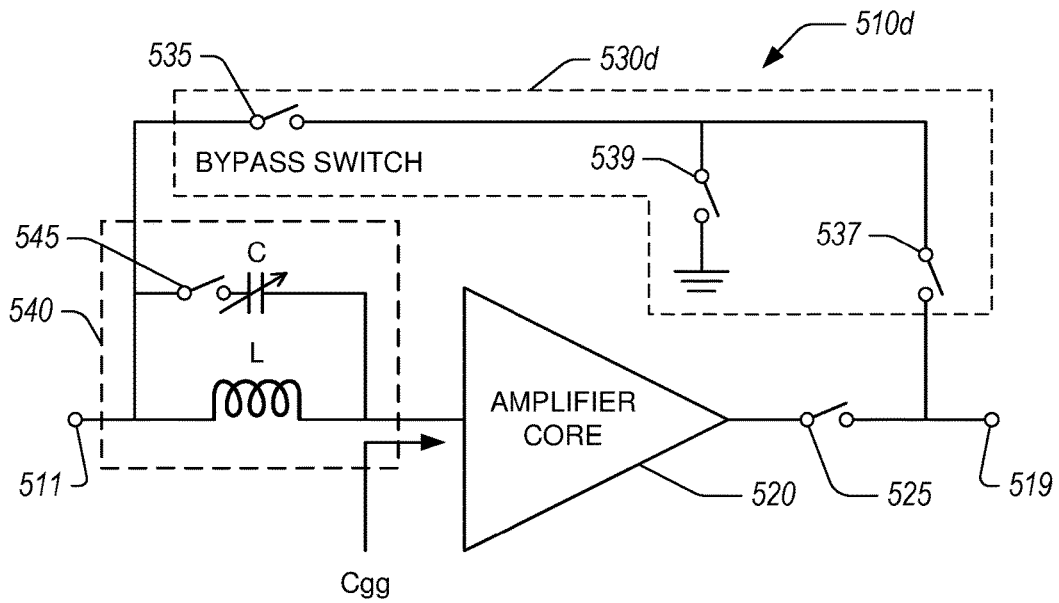

FIGS. 5A and 5B-5D illustrate two different architectures for amplifiers to facilitate discussion of differences and advantages of the amplifier architectures disclosed herein, examples of which are illustrated in FIGS. 5B, 5C and 5D. In the amplifier 510a illustrated in FIG. 5A, the amplifier 510a includes an amplifier core 520 and a bypass circuit 530a. In one or more gain modes, the bypass switch 535 is open and signals are amplified with the amplifier core 520. The inductor, L, provides input matching for the amplifier 510a.

The bypass circuit 530a includes LC matching module 531 configured to provide impedance matching for the impedance matching inductor, L, at the input node 511 and the capacitance, Cgg, seen at the input of the amplifier core 520 when the core is off. For example, the amplifier core 520 has some loading capacitance to ground, Cgg, even when the amplifier core 520 is off. Due at least in part to the combination of the input matching inductor, L, and the capacitive loading to ground, Cgg, the bypass circuit 530a includes the LC matching module 531 to reduce losses from impedance mismatch. In the bypass mode, the bypass switch 535 is closed and the LC matching module 531 provides impedance matching for the bypass path from the input node 511 to the output node 519. Although this reduces losses due to impedance mismatch, there are losses in the switch 535 and the LC matching module 531. For example, loss occurs due at least in part to capacitive loading at the amplifier input and/or limitations of the Q factor of the passive components in the LC matching module 531.

The amplifier 510a can be tailored to enhance high gain performance, however this may sacrifice performance in the bypass mode. For example, there are restrictions on the size of the bypass switch 535 because if it is too large then performance in the high gain mode can suffer. Performance in the bypass may be improved by increasing the size of the bypass switch 535, but this would load the amplifier core 520 degrading performance in one or more gain modes, which may be more pronounced or particularly less desirable in a high gain mode. As another example, the size of the amplifier core 520 affects losses in the bypass mode, so increasing the size of the amplifier core 520 can increase loss in the bypass mode. Moreover, due at least in part to active loading at the amplifier core, linearity of the bypass mode may be compromised. For example, there is non-linear capacitance coming from the amplifier core 520 when it is in the off state. There exists a leakage current through the amplifier core 520 and this leakage current, though small, can induce non-linear capacitance and therefore non-linear current.

The amplifier 510b illustrated in FIG. 5B provides advantageous performance in at least the bypass mode when compared to amplifiers with configurations similar to the amplifier 510a. The amplifier 510b includes a resonant structure 540 that includes the matching inductor, L, a variable capacitor, C, and a resonant structure switch 545. The resonant structure 540 can provide an open impedance for signals at the input node 511 when the amplifier 510b operates in the bypass mode. It should be understood that the amplifier core switch 525, the bypass switch 535, and the resonant structure switch 545 provide similar functionality to the corresponding switches 425, 435, and 445 described herein with reference to FIG. 4.

The variable capacitor of the resonant structure 540 can be configured to change to compensate for changes in the input matching inductor and/or to change the resonant frequency of the resonant structure 540. In some embodiments, the variable capacitor can be fixed based at least in part on an operating range of the amplifier 510b. In some embodiments, the inductance of the inductor, L, may change and the capacitor can be tuned to compensate for these changes. In some implementations, the variable capacitor can be replaced with a fixed-value capacitor.

Because the resonant structure 540 provides a relatively large impedance in the bypass mode, the matching inductor, L, and the capacitance, Cgg, of the amplifier core 520 are effectively de-coupled from the bypass circuit 530b. Due at least in part to this de-coupling, the bypass circuit 530b does not include an LC matching circuit in parallel with the amplifier core 520. This can advantageously decrease the size of the bypass circuit 530b. This can also advantageously reduce the complexity of the bypass circuit 530b. In example, there is no need to tune matching components in the bypass circuit 530b, as opposed to the tuning of the LC matching module 531 in the amplifier 510a. The bypass circuit 530b provides a bypass path for signals from the input node 511 to the output node 519, the bypass path not including the resonant structure 540 or the amplifier core 520. In particular, as compared to the amplifier 510 described herein with reference to FIG. 5A, the bypass path provided by the bypass circuit 530b bypasses the matching inductor, L, coupled to the input node 511. Linearity is improved in the bypass mode relative to the amplifier 510a due at least in part to the de-coupling of the non-linear capacitance of the amplifier core 520 in the off state (e.g., the capacitive loading to ground, Cgg) from the bypass path provided by the resonant structure 540.

FIG. 5C illustrates another example amplifier 510c that is similar to the amplifier 510b of FIG. 5B with a second bypass switch 537 in a bypass circuit 530c. The second bypass switch 537 may be advantageous where the bypass switch 535 is close to the input 511 of the amplifier 510c. In such configurations, the length of the trace from the bypass switch 535 to the output 519 may cause an inductive and/or capacitive load in the amplifier 510c. To isolate this trace, the second bypass switch 537 can be included to reduce or eliminate these inductive and/or capacitive loads caused by the trace from the bypass switch 535 to the output 519.

FIG. 5D illustrates another example amplifier 510d that is similar to the amplifier 510c of FIG. 5C with the addition of a shunt switch 539 in a bypass circuit 530d. The shunt switch 539 can be used to improve isolation of the bypass path. For example, when the bypass switch 535 and the second bypass switch 537 are open, the shunt switch 539 can be closed and when the bypass switch and the additional switch are closed, the shunt switch 539 can be open.

Figure 5E:
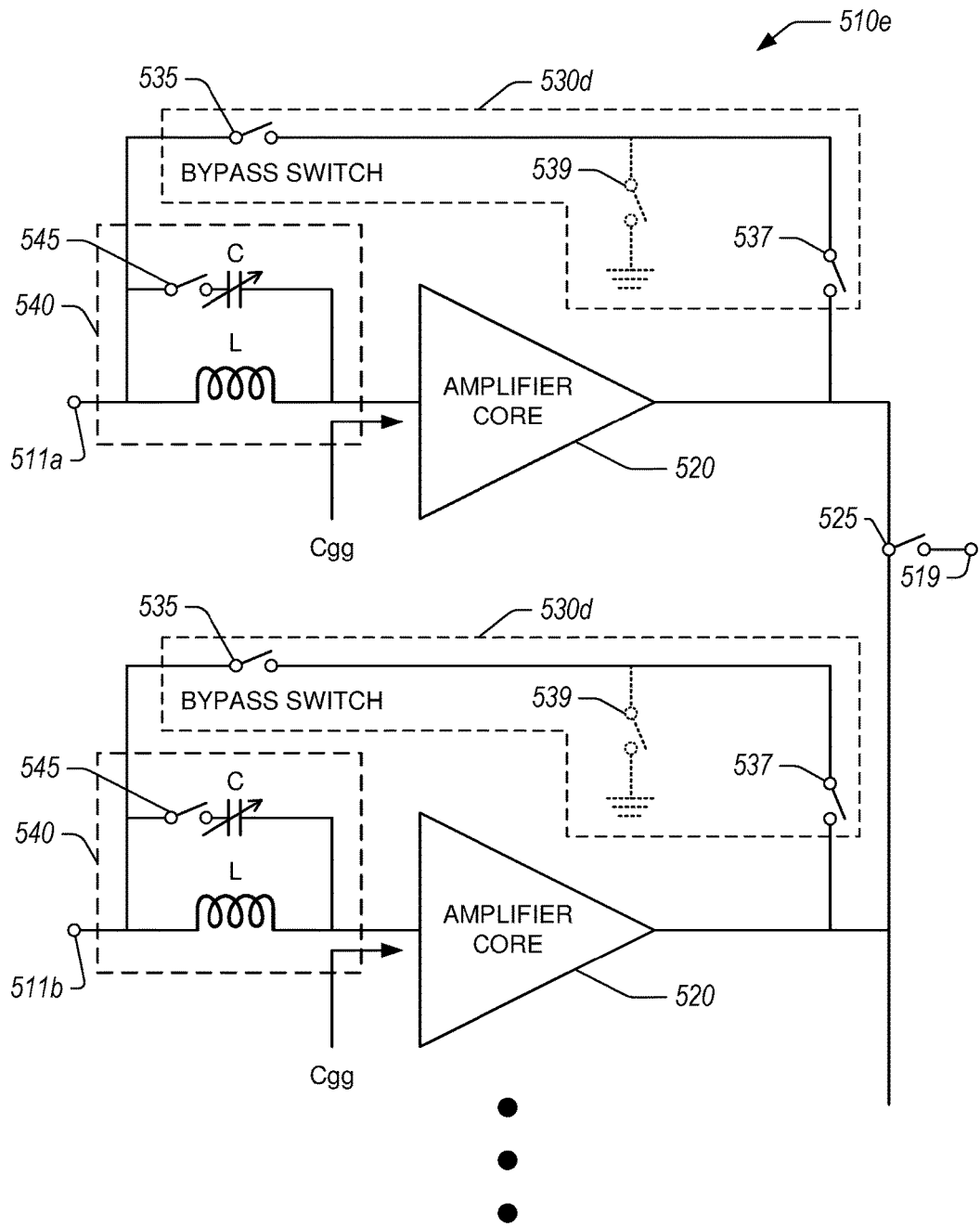
FIG. 5E illustrates an example of a multi-input amplifier architecture that includes resonant structures and bypass paths for individual amplifier cores.

FIG. 5E illustrates an example multi-input amplifier 510e having an amplifier core for each input. In the figure, only two inputs are shown, but it is to be understood that more than two inputs can be implemented. The multi-input amplifier 510e includes a plurality of inputs 511a, 511b. For each input, there is a resonant structure 540 with a resonant switch 545 and a bypass circuit 530d having a bypass switch 535, a second bypass switch 537, and an optional shunt switch 539. The second bypass switch 537 in each bypass circuit 530d can be used to couple the bypass path to the output 519 through the amplifier core switch 525.

Figure 6A:
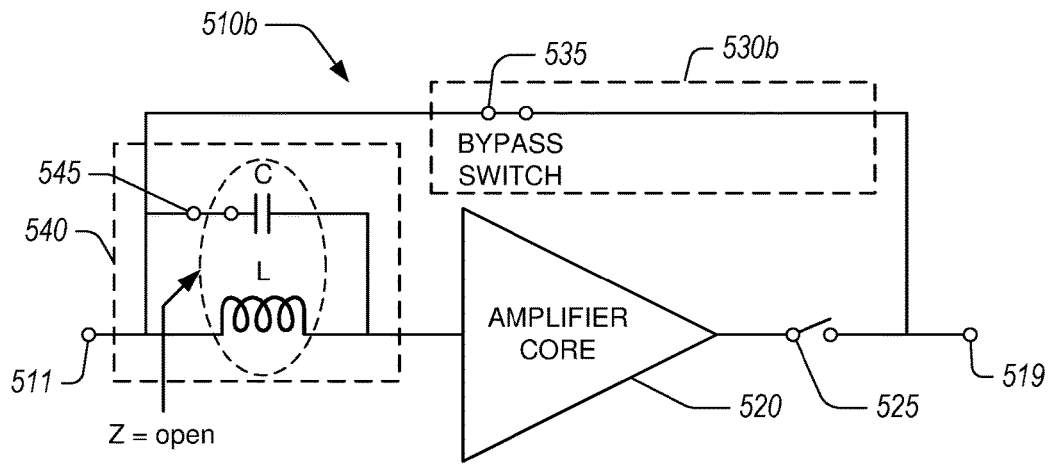
FIGS. 6A and 6B illustrate the amplifier of FIG. 5B operating in the bypass configuration.
Figure 6B:
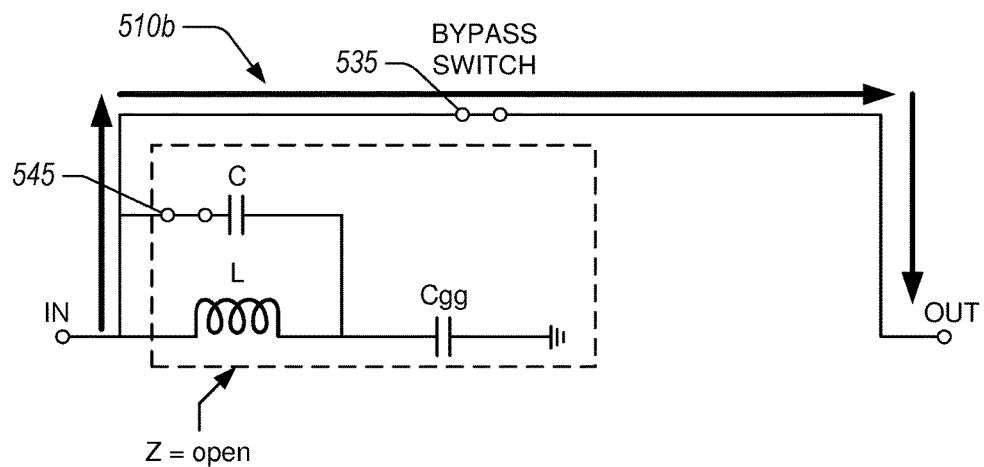

To illustrate operation of the bypass path in the amplifier 510b of FIG. 5B, FIGS. 6A and 6B illustrate the amplifier 510b in the bypass configuration (e.g., configured to operate in a bypass mode). FIG. 6A illustrates the amplifier 510b in the bypass configuration, with the resonant structure switch 545 and the bypass switch 535 closed and with the amplifier core switch 525 open. The capacitor and the inductor of the resonant structure 540 form an LC tank circuit to isolate the bypass path from the input of the amplifier core 520.

The resonant structure 540 is configured to create an open impedance looking into the input of the amplifier core 520, thereby removing loading from the amplifier core 520 to the bypass circuit 530b. In some embodiments, the amplifier 510b sees an improvement of about 2 dB to about 2.5 dB in signal loss relative to the amplifier 510a. Another advantage of the amplifier 510b is that the size of the amplifier core 520 can be tailored with little or no effect on the performance of the bypass mode. Similarly, the size of the bypass switch 535 can be tailored with little or no effect on the performance of the one or more gain modes through the amplifier core 520. Accordingly, the resonant structure 540 effectively separates or decouples the bypass circuit 530*b* from the amplifier core 520, allowing both to be independently tailored to enhance performance.

The resonant structure 540 can be configured so that, for a targeted frequency, the reactances of the capacitor, C, and inductor, L, are equal to each other. This frequency is the resonant frequency of the resonant structure 540. For example, the resonant frequency is related to the capacitance and inductance in the formula:

$$f = \frac{1}{2\pi\sqrt{LC}}$$

where f is the frequency of the input signal, L is the inductance of the inductor, and C is the capacitance of the capacitor. At the resonant frequency the total impedance increases to infinity (for an ideal LC parallel circuit), meaning that the resonant structure draws no current from the input node 511. There may be current flowing through the components of the resonant structure 540, however the current may be circulating back and forth between them without involving the input node 511. Thus, the currents may be confined to the components of the resonant structure 540 and the parallel LC circuit behaves as a "tank" circuit or a circuit that holds circulating current without releasing it. The phases of current through the inductor and the capacitor are 180 degrees offset from one another, effectively cancelling each other and thereby drawing little or no current from the input node 511. This corresponds to an infinite impedance, or an open circuit. It is understood that there are inherent resistances in the inductor and capacitor, thereby causing the resonant structure 540 to deviate from the ideal behavior. However, the relatively large impedance at the resonant structure 540 provides similar functionality as the ideal infinite impedance, that is, it effectively de-couples the amplifier core 520 and the bypass circuit 530*b*. Therefore, the discussion herein regarding resonant structures that provide an infinite impedance or an open circuit should be understood to mean that the resonant structures provide a relatively large impedance that effectively de-couples an amplifier core and a bypass circuit or path.

FIG. 6B illustrates an equivalent circuit for the amplifier 510*b* when operating in the bypass mode. The resonant structure switch 545 closes to create an LC tank circuit coupled to the input node 511. With the amplifier core 520 off, it provides a capacitive loading to ground, Cgg. The bypass switch 535 closes to provide a path from the input node 511 to the output node 519 that does not include the resonant structure 540 or the amplifier core 520. The resonant structure 540 appears as an open circuit, or it provides an impedance similar or equivalent to an open circuit so that the input signal bypasses both the resonant structure 540 and the amplifier core 520.

Examples of Products and Architectures

Figure 7:
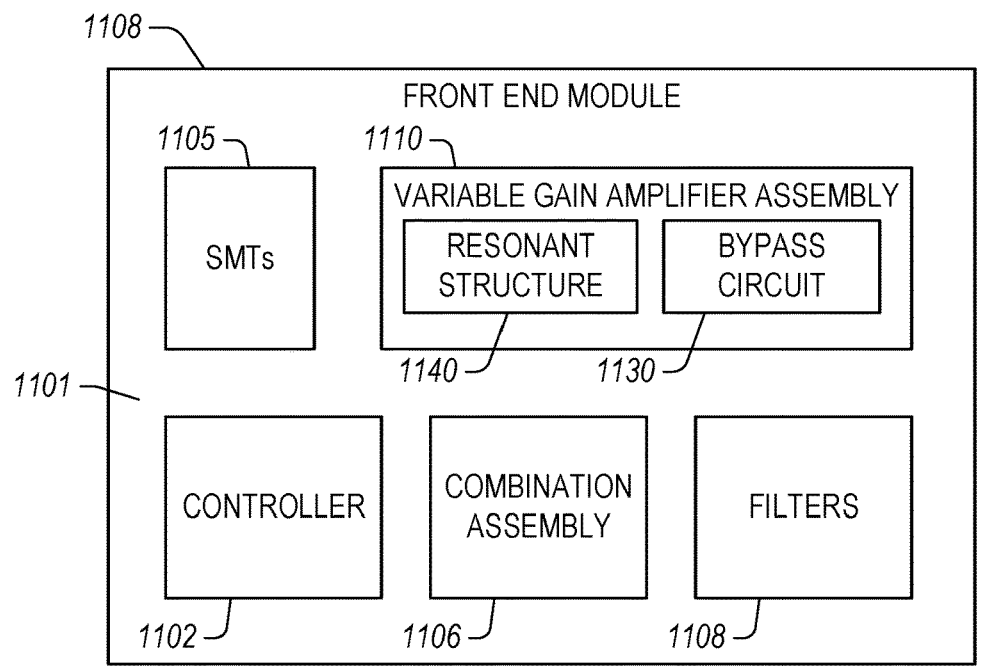
FIG. 7 illustrates that, in some embodiments, some or all of the amplifier configurations, including some or all of the amplifier configurations having combinations of features (e.g., FIGS. 1-6B), can be implemented, wholly or partially, in a module.

FIG. 7 illustrates that, in some embodiments, some or all of the amplifier configurations, including some or all of the amplifier configurations having combinations of features (e.g., FIGS. 1-6B), can be implemented, wholly or partially, in a module. Such a module can be, for example, a front-end module (FEM). Such a module can be, for example, a diversity receiver (DRx) FEM. Such a module can be, for example, a multi-input, multi-output (MiMo) module.

In the example of FIG. 7, a module 1108 can include a packaging substrate 1101, and a number of components can be mounted on such a packaging substrate 1101. For example, a controller 1102 (which may include a front-end power management integrated circuit [FE-PIMC]), a combination assembly 1106, a variable gain amplifier assembly 1110 that includes a bypass circuit 1130 and a resonant structure 1140 having one or more features as described herein, and a filter bank 1108 (which may include one or more bandpass filters) can be mounted and/or implemented on and/or within the packaging substrate 1101. Other components, such as a number of SMT devices 1105, can also be mounted on the packaging substrate 1101. Although all of the various components are depicted as being laid out on the packaging substrate 1101, it will be understood that some component(s) can be implemented over other component(s).

In some embodiments, the module 1108 can have the amplifier assembly 1110 implemented on a semiconductor die that is in turn mounted on the packaging substrate 1101. In further embodiments, the resonant structure 1140 of the amplifier assembly 1110 can be implemented on a single semiconductor die that includes the bypass circuit 1130 and an amplifier core, the semiconductor die being mounted on the packaging substrate 1101. In various embodiments, an amplifier core and the bypass circuit 1130 are implemented on a semiconductor die that does not include the resonant structure 1140.

Figure 8:
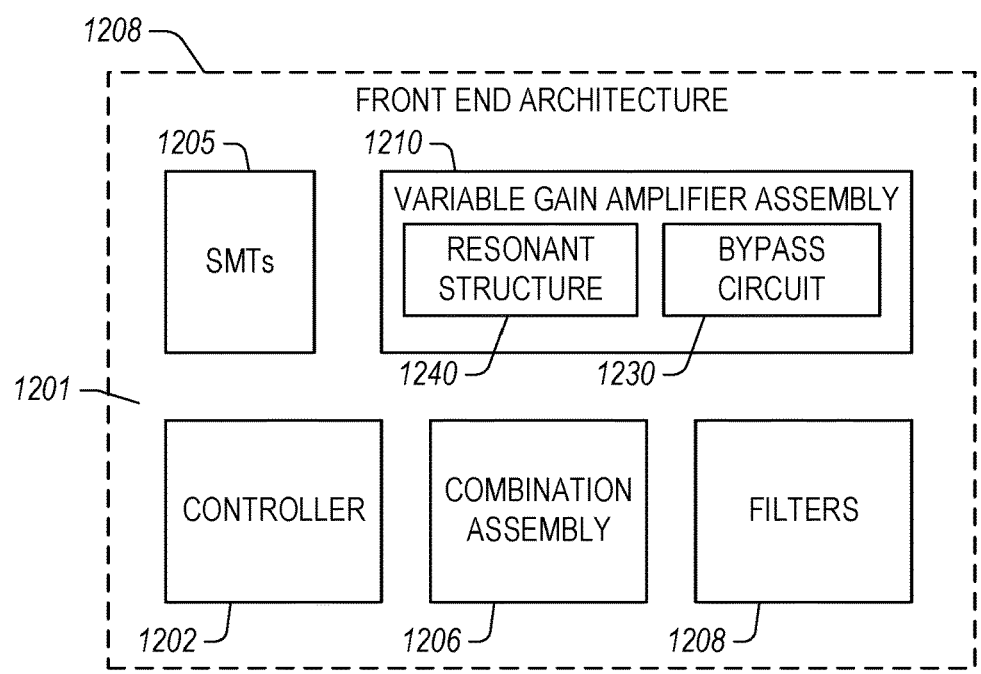
FIG. 8 illustrates that, in some embodiments, some or all of the amplifier configurations, including some or all of the amplifier configurations having combinations of features (e.g., FIGS. 1-6B), can be implemented, wholly or partially, in an architecture.

FIG. 8 shows that, in some embodiments, some or all of the amplifier configurations, including some or all of the amplifier configurations having combinations of features (e.g., FIGS. 1-6B), can be implemented, wholly or partially, in an architecture. Such an architecture may include one or more modules, and can be configured to provide front-end functionality such as diversity receiver (DRx) front-end functionality.

In the example of FIG. 8, an architecture 1208 can include a controller 1202 (which may include a front-end power management integrated circuit [FE-PIMC]), a combination assembly 1206, a variable gain amplifier assembly 1210 that includes a bypass circuit 1230 and a resonant structure 1240 having one or more features as described herein, and a filter bank 1208 (which may include one or more bandpass filters) can be mounted and/or implemented on and/or within the packaging substrate 1201. Other components, such as a number of SMT devices 1205, can also be implemented in the architecture 1208.

In some implementations, a device and/or a circuit having one or more features described herein can be included in an RF electronic device such as a wireless device. Such a device and/or a circuit can be implemented directly in the wireless device, in a modular form as described herein, or in some combination thereof. In some embodiments, such a wireless device can include, for example, a cellular phone, a smart-phone, a hand-held wireless device with or without phone functionality, a wireless tablet, etc.

Figure 9:
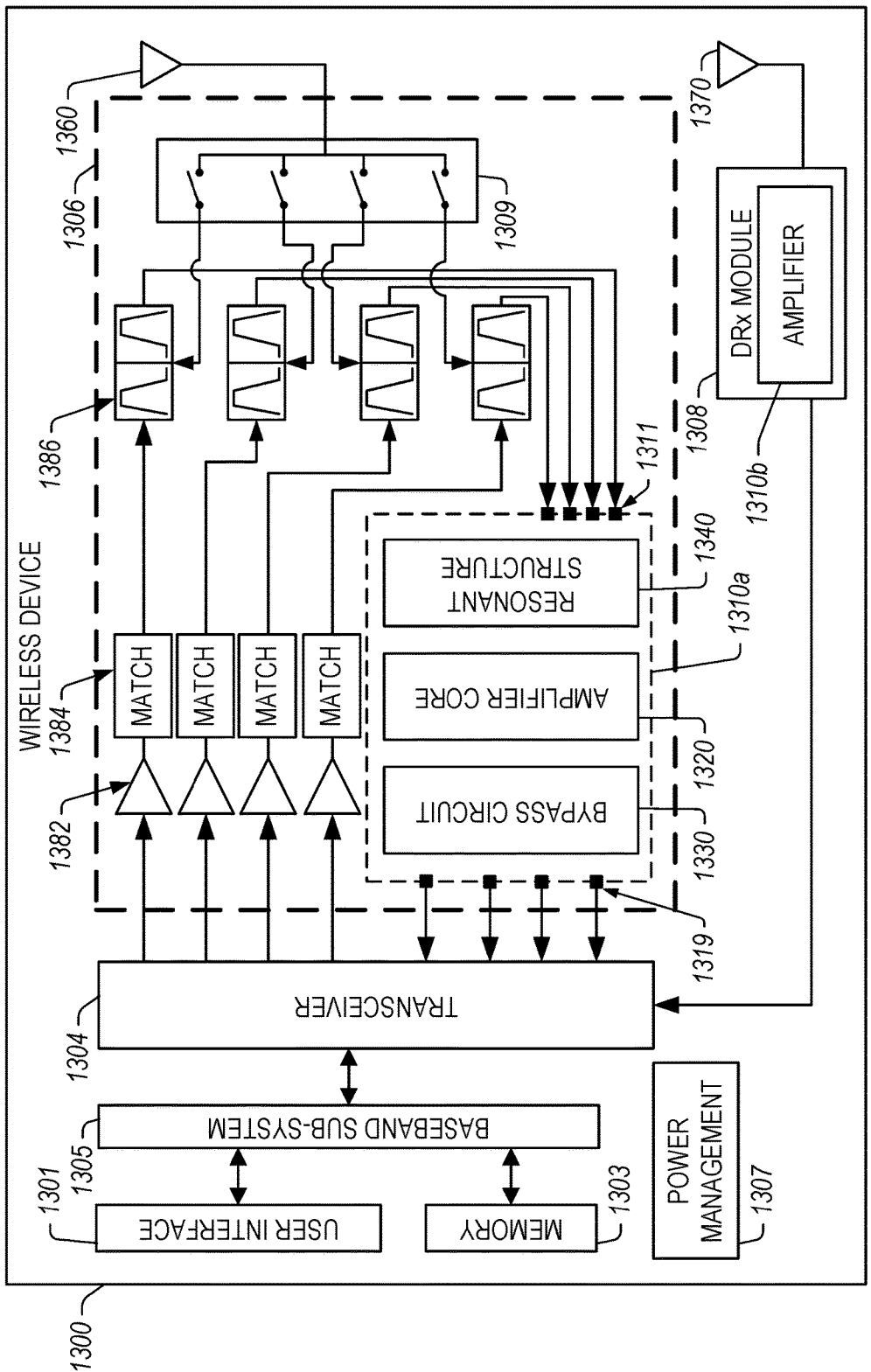
FIG. 9 illustrates an example wireless device having one or more advantageous features described herein.

FIG. 9 depicts an example wireless device 1300 having one or more advantageous features described herein. In the context of one or more modules having one or more features as described herein, such modules can be generally depicted by a dashed box 1306 (which can be implemented as, for example, a front-end module) and a diversity receiver (DRx) module 1308 (which can be implemented as, for example, a front-end module).

Referring to FIG. 9, power amplifiers (PAs) 1382 can receive their respective RF signals from a transceiver 1304 that can be configured and operated to generate RF signals to be amplified and transmitted, and to process received signals. The transceiver 1304 is shown to interact with a baseband sub-system 1305 that is configured to provide conversion between data and/or voice signals suitable for a user and RF signals suitable for the transceiver 1304. The transceiver 1304 can also be in communication with a power management component 1307 that is configured to manage power for the operation of the wireless device 1300. Such power management can also control operations of the baseband sub-system 1305 and the modules 1306 and 1308.

The baseband sub-system 1305 is shown to be connected to a user interface 1301 to facilitate various input and output of voice and/or data provided to and received from the user. The baseband sub-system 1305 can also be connected to a memory 1303 that is configured to store data and/or instructions to facilitate the operation of the wireless device, and/or to provide storage of information for the user.

In the example wireless device 1300, outputs of the PAs 1382 are shown to be matched (via respective match circuits 1384) and routed to their respective duplexers 1386. Such amplified and filtered signals can be routed to a primary antenna 1360 through a switching network 1309 for transmission. In some embodiments, the duplexers 1386 can allow transmit and receive operations to be performed simultaneously using a common antenna (e.g., primary antenna 1360). In FIG. 9, received signals are shown to be routed to an amplifier assembly 1310*a*, which provides the features and benefits of the variable gain amplifiers described herein. The DRx module 1308 includes a similar amplifier assembly 1310*b* as well.

In the example wireless device 1300, signals received at the primary antenna 1360 can be sent to an amplifier assembly 1310*a* in the front end module 1306. The amplifier assembly 1310*a* can include an amplifier core 1320, a bypass circuit 1330, and a resonant structure 1340. The amplifier assembly 1310*a* is configured to receive a plurality of signals at inputs 1311 and to output a plurality of processed signals at outputs 1319. The amplifier assembly 1310*a* is configured to amplify signals based at least in part on a gain mode and to provide a passive bypass mode with the bypass circuit 1330 based at least in part on the operating mode. The resonant structure 1340 can be configured to de-couple the amplifier core 1320 and the bypass circuit 1330. This can be done to improve performance in the bypass mode relative to amplifiers that do not include one or more of the described features.

The wireless device also includes a diversity antenna 1370 and a diversity receiver module 1308 that receives signals from the diversity antenna 1370. The diversity receive module 1308 includes an amplifier assembly 1310*b*, similar to the amplifier assembly 1310*a* in the front end module 1306. The diversity receiver module 1308 and the amplifier assembly 1310*b* process the received signals and transmit the processed signals to the transceiver 1304. In some embodiments, a diplexer, triplexer, or other multiplexer or filter assembly can be included between the diversity antenna 1370 and the diversity receiver module 1308, as described herein.

One or more features of the present disclosure can be implemented with various cellular frequency bands as described herein. Examples of such bands are listed in Table 1. It will be understood that at least some of the bands can be divided into sub-bands. It will also be understood that one or more features of the present disclosure can be implemented with frequency ranges that do not have designations such as the examples of Table 1. It is to be understood that the term radio frequency (RF) and radio frequency signals refers to signals that include at least the frequencies listed in Table 1.

TABLE 1

| Band | Mode | Tx Frequency Range (MHz) | Rx Frequency Range (MHz) |
|---|---|---|---|
| B1 | FDD | 1,920-1,980 | 2,110-2,170 |
| B2 | FDD | 1,850-1,910 | 1,930-1,990 |
| B3 | FDD | 1,710-1,785 | 1,805-1,880 |
| B4 | FDD | 1,710-1,755 | 2,110-2,155 |
| B5 | FDD | 824-849 | 869-894 |
| B6 | FDD | 830-840 | 875-885 |
| B7 | FDD | 2,500-2,570 | 2,620-2,690 |
| B8 | FDD | 880-915 | 925-960 |
| B9 | FDD | 1,749.9-1,784.9 | 1,844.9-1,879.9 |
| B10 | FDD | 1,710-1,770 | 2,110-2,170 |
| B11 | FDD | 1,427.9-1,447.9 | 1,475.9-1,495.9 |
| B12 | FDD | 699-716 | 729-746 |
| B13 | FDD | 777-787 | 746-756 |
| B14 | FDD | 788-798 | 758-768 |
| B15 | FDD | 1,900-1,920 | 2,600-2,620 |
| B16 | FDD | 2,010-2,025 | 2,585-2,600 |
| B17 | FDD | 704-716 | 734-746 |
| B18 | FDD | 815-830 | 860-875 |
| B19 | FDD | 830-845 | 875-890 |
| B20 | FDD | 832-862 | 791-821 |
| B21 | FDD | 1,447.9-1,462.9 | 1,495.9-1,510.9 |
| B22 | FDD | 3,410-3,490 | 3,510-3,590 |
| B23 | FDD | 2,000-2,020 | 2,180-2,200 |
| B24 | FDD | 1,626.5-1,660.5 | 1,525-1,559 |
| B25 | FDD | 1,850-1,915 | 1,930-1,995 |
| B26 | FDD | 814-849 | 859-894 |
| B27 | FDD | 807-824 | 852-869 |
| B28 | FDD | 703-748 | 758-803 |
| B29 | FDD | N/A | 716-728 |
| B30 | FDD | 2,305-2,315 | 2,350-2,360 |
| B31 | FDD | 452.5-457.5 | 462.5-467.5 |
| B32 | FDD | N/A | 1,452-1,496 |
| B33 | TDD | 1,900-1,920 | 1,900-1,920 |
| B34 | TDD | 2,010-2,025 | 2,010-2,025 |
| B35 | TDD | 1,850-1,910 | 1,850-1,910 |
| B36 | TDD | 1,930-1,990 | 1,930-1,990 |
| B37 | TDD | 1,910-1,930 | 1,910-1,930 |
| B38 | TDD | 2,570-2,620 | 2,570-2,620 |
| B39 | TDD | 1,880-1,920 | 1,880-1,920 |
| B40 | TDD | 2,300-2,400 | 2,300-2,400 |
| B41 | TDD | 2,496-2,690 | 2,496-2,690 |
| B42 | TDD | 3,400-3,600 | 3,400-3,600 |
| B43 | TDD | 3,600-3,800 | 3,600-3,800 |
| B44 | TDD | 703-803 | 703-803 |
| B45 | TDD | 1,447-1,467 | 1,447-1,467 |
| B46 | TDD | 5,150-5,925 | 5,150-5,925 |
| B65 | FDD | 1,920-2,010 | 2,110-2,200 |
| B66 | FDD | 1,710-1,780 | 2,110-2,200 |
| B67 | FDD | N/A | 738-758 |
| B68 | FDD | 698-728 | 753-783 |

The present disclosure describes various features, no single one of which is solely responsible for the benefits described herein. It will be understood that various features described herein may be combined, modified, or omitted, as would be apparent to one of ordinary skill. Other combinations and sub-combinations than those specifically described herein will be apparent to one of ordinary skill, and are intended to form a part of this disclosure. Various methods are described herein in connection with various flowchart steps and/or phases. It will be understood that in many cases, certain steps and/or phases may be combined together such that multiple steps and/or phases shown in the flowcharts can be performed as a single step and/or phase. Also, certain steps and/or phases can be broken into additional sub-components to be performed separately. In some instances, the order of the steps and/or phases can be rearranged and certain steps and/or phases may be omitted entirely. Also, the methods described herein are to be understood to be open-ended, such that additional steps and/or phases to those shown and described herein can also be performed.

Some aspects of the systems and methods described herein can advantageously be implemented using, for example, computer software, hardware, firmware, or any combination of computer software, hardware, and firmware. Computer software can comprise computer executable code stored in a computer readable medium (e.g., non-transitory computer readable medium) that, when executed, performs the functions described herein. In some embodiments, computer-executable code is executed by one or more general purpose computer processors. A skilled artisan will appreciate, in light of this disclosure, that any feature or function that can be implemented using software to be executed on a general purpose computer can also be implemented using a different combination of hardware, software, or firmware. For example, such a module can be implemented completely in hardware using a combination of integrated circuits. Alternatively or additionally, such a feature or function can be implemented completely or partially using specialized computers designed to perform the particular functions described herein rather than by general purpose computers.

Multiple distributed computing devices can be substituted for any one computing device described herein. In such distributed embodiments, the functions of the one computing device are distributed (e.g., over a network) such that some functions are performed on each of the distributed computing devices.

Some embodiments may be described with reference to equations, algorithms, and/or flowchart illustrations. These methods may be implemented using computer program instructions executable on one or more computers. These methods may also be implemented as computer program products either separately, or as a component of an apparatus or system. In this regard, each equation, algorithm, block, or step of a flowchart, and combinations thereof, may be implemented by hardware, firmware, and/or software including one or more computer program instructions embodied in computer-readable program code logic. As will be appreciated, any such computer program instructions may be loaded onto one or more computers, including without limitation a general purpose computer or special purpose computer, or other programmable processing apparatus to produce a machine, such that the computer program instructions which execute on the computer(s) or other programmable processing device(s) implement the functions specified in the equations, algorithms, and/or flowcharts. It will also be understood that each equation, algorithm, and/or block in flowchart illustrations, and combinations thereof, may be implemented by special purpose hardware-based computer systems which perform the specified functions or steps, or combinations of special purpose hardware and computer-readable program code logic means.

Furthermore, computer program instructions, such as embodied in computer-readable program code logic, may also be stored in a computer readable memory (e.g., a non-transitory computer readable medium) that can direct one or more computers or other programmable processing devices to function in a particular manner, such that the instructions stored in the computer-readable memory implement the function(s) specified in the block(s) of the flowchart(s). The computer program instructions may also be loaded onto one or more computers or other programmable computing devices to cause a series of operational steps to be performed on the one or more computers or other programmable computing devices to produce a computer-implemented process such that the instructions which execute on the computer or other programmable processing apparatus provide steps for implementing the functions specified in the equation(s), algorithm(s), and/or block(s) of the flowchart(s).

Some or all of the methods and tasks described herein may be performed and fully automated by a computer system. The computer system may, in some cases, include multiple distinct computers or computing devices (e.g., physical servers, workstations, storage arrays, etc.) that communicate and interoperate over a network to perform the described functions. Each such computing device typically includes a processor (or multiple processors) that executes program instructions or modules stored in a memory or other non-transitory computer-readable storage medium or device. The various functions disclosed herein may be embodied in such program instructions, although some or all of the disclosed functions may alternatively be implemented in application-specific circuitry (e.g., ASICs or FPGAs) of the computer system. Where the computer system includes multiple computing devices, these devices may, but need not, be co-located. The results of the disclosed methods and tasks may be persistently stored by transforming physical storage devices, such as solid state memory chips and/or magnetic disks, into a different state.

Unless the context clearly requires otherwise, throughout the description and the claims, the words "comprise," "comprising," and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list. The word "exemplary" is used exclusively herein to mean "serving as an example, instance, or illustration." Any implementation described herein as "exemplary" is not necessarily to be construed as preferred or advantageous over other implementations.

The disclosure is not intended to be limited to the implementations shown herein. Various modifications to the implementations described in this disclosure may be readily apparent to those skilled in the art, and the generic principles defined herein may be applied to other implementations without departing from the spirit or scope of this disclosure. The teachings of the invention provided herein can be applied to other methods and systems, and are not limited to the methods and systems described above, and elements and acts of the various embodiments described above can be combined to provide further embodiments. Accordingly, the novel methods and systems described herein may be embodied in a variety of other forms; furthermore, various omissions, substitutions and changes in the form of the methods and systems described herein may be made without departing from the spirit of the disclosure. The accompanying claims and their equivalents are intended to cover such forms or modifications as would fall within the scope and spirit of the disclosure.

What is claimed is:

1. A variable-gain signal amplifier configured to operate in one or more gain modes and in a bypass mode, the amplifier comprising:
an input node configured to receive an input signal;
an output node configured to provide an output signal;
an amplifier core configured to amplify the input signal and to provide the amplified output signal to the output node in the one or more gain modes;
a resonant structure including a resonant structure switch, a capacitor, and an inductor in parallel with the capacitor, the resonant structure configured to provide a substantially open impedance in the bypass mode; and
a bypass circuit coupled to the input node, the resonant structure, and the output node, the bypass circuit including a bypass switch configured to provide a bypass path from the input node to the output node that bypasses the amplifier core in the bypass mode.

2. The amplifier of claim 1 wherein the variable-gain signal amplifier comprises a low-noise amplifier.

3. The amplifier of claim 1 wherein the capacitor of the resonant structure is a variable capacitor.

4. The amplifier of claim 1 wherein the resonant structure switch is coupled in series with the capacitor.

5. The amplifier of claim 4 wherein the resonant structure switch and the capacitor are coupled in parallel with the inductor.

6. The amplifier of claim 1 wherein the resonant structure switch is open in the one or more gain modes and the resonant structure switch is closed in the bypass mode.

7. The amplifier of claim 1 wherein the inductor is configured to provide input impedance matching for the amplifier.

8. The amplifier of claim 1 further comprising an amplifier core output switch configured to selectively couple the output node to an output of the amplifier core.

9. The amplifier of claim 8 wherein the amplifier core switch is open in the bypass mode.

10. The amplifier of claim 1 wherein the bypass circuit does not include an LC matching circuit in parallel with the amplifier core.

11. The amplifier of claim 1 wherein the bypass circuit provides a bypass path for signals from the input node to the output node, the bypass path not including the resonant structure or the amplifier core.

12. The amplifier of claim 1 wherein the bypass circuit provides a bypass path for signals from the input node to the output node, the bypass path configured to bypass an inductor coupled to the input node.

13. The amplifier of claim 1 further comprising a control circuit configured to generate an amplification control signal to switch between the one or more gain modes and the bypass mode.

14. A radio-frequency module comprising:
a packaging substrate configured to receive a plurality of components; and
an amplifier implemented on the packaging substrate, the amplifier configured to provide one or more gain modes and a bypass mode, the amplifier including an input node and an output node, the amplifier further including an amplifier core configured to amplify an input signal and to provide an amplified output signal to the output node, the amplifier further including a resonant structure including a resonant structure switch, a capacitor, and an inductor in parallel with the capacitor, and the amplifier further including a bypass circuit coupled to the input node, the resonant structure, and the output node, the bypass circuit having a bypass switch configured to provide a bypass path from the input node to the output node that bypasses the amplifier core in the bypass mode, the resonant structure being implemented on a single semiconductor die with the amplifier core and the bypass circuit, the semiconductor die being mounted on the packaging substrate.

15. The module of claim 14 wherein the amplifier is implemented on a semiconductor die that is mounted on the packaging substrate.

16. A wireless device comprising:
an antenna configured to at least receive a radio-frequency signal;
a variable gain signal amplifier in communication with the antenna and configured to provide one or more gain modes and a bypass mode, the amplifier including an input node and an output node, the amplifier also including an amplifier core configured to amplify an input signal to provide an output signal to the output node, the amplifier also including a resonant structure including a resonant structure switch, a capacitor, and an inductor in parallel with the capacitor, the resonant structure configured to provide a substantially open impedance in the bypass mode, and the amplifier also including a bypass circuit coupled to the input node, the resonant structure, and the output node, the bypass circuit having a bypass switch configured to provide a bypass path from the input node to the output node that bypasses the amplifier core in the bypass mode to provide the output signal at the output node; and
a controller implemented to control the variable gain signal amplifier to switch between the one or more gain modes and the bypass mode.

17. The device of claim 16 further comprising a transceiver configured to process the output signal provided by the amplifier.

* * * * *